United States Patent
Uzoh et al.

(10) Patent No.: US 7,670,473 B1
(45) Date of Patent: Mar. 2, 2010

(54) WORKPIECE SURFACE INFLUENCING DEVICE DESIGNS FOR ELECTROCHEMICAL MECHANICAL PROCESSING AND METHOD OF USING THE SAME

(76) Inventors: Cyprian E. Uzoh, 3928 Thompson Creek Ct., San Jose, CA (US) 95135; Bulent M. Basol, 3001 Maple Ave., Manhattan Beach, CA (US) 90266

(*) Notice: Subject to any disclaimer, the term of this patent is extended or adjusted under 35 U.S.C. 154(b) by 339 days.

(21) Appl. No.: 11/786,948

(22) Filed: Apr. 12, 2007

Related U.S. Application Data

(60) Division of application No. 10/302,755, filed on Nov. 21, 2002, now Pat. No. 7,204,917, and a continuation-in-part of application No. 10/165,673, filed on Jun. 6, 2002, now Pat. No. 6,837,979, which is a division of application No. 09/373,681, filed on Aug. 13, 1999, now Pat. No. 6,409,904, which is a continuation-in-part of application No. 09/201,929, filed on Dec. 1, 1998, now Pat. No. 6,176,992, and a continuation-in-part of application No. 09/285,621, filed on Apr. 3, 1999, now Pat. No. 6,328,872.

(60) Provisional application No. 60/331,783, filed on Nov. 21, 2001.

(51) Int. Cl.
  *B23H 5/08* (2006.01)
  *C25D 5/08* (2006.01)
  *C25D 17/00* (2006.01)

(52) U.S. Cl. ............ 205/663; 205/80; 205/87; 204/224 M; 204/279

(58) Field of Classification Search .......... 205/80, 205/87, 663; 204/224 M, 279
See application file for complete search history.

(56) References Cited

U.S. PATENT DOCUMENTS 2,194,472 A  3/1940  Jackson (Continued)

FOREIGN PATENT DOCUMENTS

DE  2008664  9/1971

(Continued)

OTHER PUBLICATIONS

Contolini et al. "Electrochemical Planarization for Multilevel Metallization," pp. 2503-2510 (Sep. 1994).

(Continued)

*Primary Examiner*—Harry D. Wilkins, III
*Assistant Examiner*—Nicholas A. Smith
(74) *Attorney, Agent, or Firm*—Knobbe Martens Olson & Bear, LLP

(57) ABSTRACT

The present invention is directed to a top surface of a workpiece surface influencing device and a method of using the same. The top surface of the workpiece surface influencing device is adapted for use in an electrochemical mechanical processing apparatus in which a solution becomes disposed onto a conductive surface of a workpiece and electrochemical mechanical processing of the conductive surface is performed while relative movement and physical contact exists between the top surface and the conductive surface. The top surface comprises a ceramic material that presents a substantially planar contact area to the conductive surface, the ceramic material having a hardness greater than that of the conductive surface. A plurality of channels are formed through the top surface.

18 Claims, 5 Drawing Sheets

U.S. PATENT DOCUMENTS

| | | |
|---|---|---|
| 3,395,092 A | 7/1968 | Ribes |
| 3,436,259 A | 4/1969 | Regh et al. |
| 3,754,359 A | 8/1973 | Scandaletos |
| 3,788,011 A | 1/1974 | Hutchins |
| 3,890,746 A | 6/1975 | Saegusa et al. |
| 3,922,207 A | 11/1975 | Lowrey, Jr. et al. |
| 3,959,089 A | 5/1976 | Watts |
| 4,610,772 A | 9/1986 | Palnik |
| 5,024,735 A | 6/1991 | Kadija |
| 5,104,421 A | 4/1992 | Takizawa et al. |
| 5,167,747 A | 12/1992 | Kadija |
| 5,171,412 A | 12/1992 | Talieh et al. |
| 5,250,084 A | 10/1993 | Lansell et al. |
| 5,272,111 A | 12/1993 | Kosaki |
| 5,348,615 A | 9/1994 | Gupta |
| 5,360,462 A | 11/1994 | Harmer et al. |
| 5,429,733 A | 7/1995 | Ishida |
| 5,558,568 A | 9/1996 | Talleh et al. |
| 5,650,039 A | 7/1997 | Talleh |
| 5,692,947 A | 12/1997 | Talieh et al. |
| 5,755,859 A | 5/1998 | Brusic et al. |
| 5,782,679 A | 7/1998 | Hunter |
| 5,807,165 A | 9/1998 | Uzoh et al. |
| 5,833,820 A | 11/1998 | Dubin |
| 5,863,412 A | 1/1999 | Ichinose et al. |
| 5,876,266 A | 3/1999 | Miller et al. |
| 5,930,669 A | 7/1999 | Uzoh |
| 5,933,753 A | 8/1999 | Simon et al. |
| 5,975,988 A | 11/1999 | Christianson |
| 6,004,880 A | 12/1999 | Liu et al. |
| 6,039,631 A | 3/2000 | Sato et al. |
| 6,051,495 A | 4/2000 | Burke et al. |
| 6,110,011 A | 8/2000 | Somekh et al. |
| 6,121,143 A | 9/2000 | Messner et al. |
| 6,126,992 A | 10/2000 | Khanarian et al. |
| 6,136,043 A | 10/2000 | Robinson |
| 6,176,992 B1 | 1/2001 | Talleh |
| 6,242,349 B1 | 6/2001 | Nogami et al. |
| 6,328,872 B1 | 12/2001 | Talieh et al. |
| 6,331,135 B1 | 12/2001 | Sabde et al. |
| 6,332,832 B1 | 12/2001 | Suzuki |
| 6,368,198 B1 | 4/2002 | Sung et al. |
| 6,409,904 B1 | 6/2002 | Uzoh et al. |
| 6,413,388 B1 | 7/2002 | Uzoh et al. |
| 6,488,575 B2 | 12/2002 | Agarwal et al. |
| 6,517,424 B2 | 2/2003 | Wielonski et al. |
| 6,534,116 B2 | 3/2003 | Basol |
| 6,561,890 B2 | 5/2003 | Tominaga |
| 6,572,755 B2 | 6/2003 | Emesh et al. |
| 6,610,190 B2 | 8/2003 | Basol et al. |
| 6,649,523 B2 | 11/2003 | Basol et al. |
| 6,736,952 B2 | 5/2004 | Emesh et al. |
| 6,755,728 B2 | 6/2004 | Sugiura |
| 6,761,620 B2 | 7/2004 | Naujok |
| 2002/0053516 A1 | 5/2002 | Basol et al. |
| 2002/0068516 A1 | 6/2002 | Chen et al. |
| 2002/0108861 A1 | 8/2002 | Emesh et al. |
| 2002/0121445 A1 | 9/2002 | Basol |
| 2002/0148732 A1 | 10/2002 | Emesh et al. |
| 2003/0064669 A1 | 4/2003 | Basol |
| 2003/0217927 A1 | 11/2003 | Basol et al. |
| 2004/0102049 A1 | 5/2004 | Basol |
| 2005/0287932 A1 | 12/2005 | Basol |

FOREIGN PATENT DOCUMENTS

| | | |
|---|---|---|
| DE | 38 40 310 | 7/1989 |
| DE | 42 03 915 | 2/1993 |
| DE | 4324330 | 3/1994 |
| EP | 0903774 | 3/1999 |
| EP | 0960693 | 12/1999 |
| FR | 2 746 689 | 10/1997 |
| GB | 1 360 015 | 7/1974 |
| GB | 2162694 | 2/1986 |
| JP | 2001-025957 | 1/2001 |
| WO | WO 95/00295 | 1/1995 |
| WO | WO 97/13009 | 4/1997 |
| WO | WO 99/25004 | 5/1999 |

OTHER PUBLICATIONS

Madore et al., "Blocking Inhibitors in Catholic Leveling," I. "Theroretical Analysis," pp. 3927-3942 (Dec. 1996).

Rubinstein, M. "Tampongalvanisieren in der Praxis, Teil 1." *Galvanotechnik*, vol. 79, No. 10, pp. 3263-3270 (1988).

Steigerwald et al., "Pattern Geometry Effects in the Chemical-Mechanical Polishing of Inlaid Copper Structures," pp. 3842-2848 (Oct. 1994).

West et al., "Pulse Reverse Copper Electrodeposition in High Aspect Ration Trenches and Vias," pp. 3070-3073 (Sep. 1998).

WORKPIECE SURFACE INFLUENCING DEVICE DESIGNS FOR ELECTROCHEMICAL MECHANICAL PROCESSING AND METHOD OF USING THE SAME

CROSS-REFERENCE TO RELATED APPLICATIONS

This application is a divisional of U.S. patent application Ser. No. 10/302,755, filed Nov. 21, 2002, now U.S. Pat. No. 7,204,917, which claims priority to U.S. Provisional Application No. 60/331,783 filed Nov. 21, 2001. U.S. patent application Ser. No. 10/302,755 is a continuation-in-part of U.S. patent application Ser. No. 10/165,673 filed Jun. 6, 2002, now U.S. Pat. No. 6,837,979, which is a divisional of U.S. patent application Ser. No. 09/373,681, filed Aug. 13, 1999, now U.S. Pat. No. 6,409,904, which is a continuation-in-part application of U.S. patent application Ser. No. 09/201,929, filed Dec. 1, 1998, now U.S. Pat. No. 6,176,992, and U.S. patent application Ser. No. 09/285,621, filed Apr. 3, 1999, now U.S. Pat. No. 6,328,872. The disclosures of the foregoing applications and patents are hereby incorporated by reference in their entireties.

FIELD OF THE INVENTION

The present invention relates to manufacture of semiconductor integrated circuits and, more particularly to a method for planar deposition or etching of conductive layers.

BACKGROUND OF THE INVENTION

Conventional semiconductor devices generally include a semiconductor substrate, usually a silicon substrate, and a plurality of sequentially formed dielectric interlayers such as silicon dioxide and conductive paths or interconnects made of conductive materials. Copper and copper alloys have recently received considerable attention as interconnect materials because of their superior electromigration and low resistivity characteristics. The interconnects are usually formed by filling copper in features or cavities etched into the dielectric interlayers by a metallization process. The preferred method of copper metallization process is electroplating. In an integrated circuit, multiple levels of interconnect networks laterally extend with respect to the substrate surface. Interconnects formed in sequential interlayers can be electrically connected using vias or contacts.

In a typical process, first an insulating interlayer is formed on the semiconductor substrate. Patterning and etching processes are performed to form features such as trenches and vias in the insulating layer. Then, copper is electroplated to fill all the features. However, the plating process results in a thick copper layer on the substrate some of which need to be removed before the subsequent step. Conventionally, after the copper plating, CMP process is employed to globally planarize or reduce the thickness of the copper layer down to the level of the surface of the insulation layer. However, CMP process is a costly and time consuming process that reduces production efficiency.

The adverse effects of conventional material removal technologies may be minimized or overcome by employing an Electrochemical Mechanical Processing (ECMPR) approach that has the ability to provide thin layers of planar conductive material on the workpiece surface, or even provide a workpiece surface with no or little excess conductive material. The term of Electrochemical Mechanical Processing (ECMPR) is used to include both Electrochemical Mechanical Deposition (ECMD) processes as well as Electrochemical Mechanical Etching (ECME), which is also called Electrochemical Mechanical Polishing. It should be noted that in general both ECMD and ECME processes are referred to as electrochemical mechanical processing (ECMPR) since both involve electrochemical processes and mechanical action.

FIG. 1 shows an exemplary conventional ECMPR system 2, which system 2 includes a workpiece-surface-influencing device (WSID) 3 such as a mask, pad or a sweeper, a carrier head 4 holding a workpiece 5 and an electrode 6. The workpiece-surface-influencing-device (WSID) is used during at least a portion of the electrotreatment process when there is physical contact or close proximity and relative motion between the workpiece surface and the WSID. Surface of the WSID 3 sweeps the surface of the workpiece 5 while an electrical potential is established between the electrode 6 and the surface of the workpiece. Channels 7 of the WSID 3 allow a process solution 8 such as an electrolyte to flow to the surface of the workpiece 5. If the ECMD process is carried out, the surface of the workpiece 5 is wetted by a deposition electrolyte which is also in fluid contact with the electrode (anode) and a potential is applied between the surface of the workpiece and the electrode rendering the workpiece surface cathodic. If the ECME process is carried out, the surface of the workpiece 5 is wetted by the deposition electrolyte or a special etching electrolyte, which is also in fluid contact with an electrode (cathode) and a potential is applied between the surface of the workpiece and the electrode rendering the workpiece surface anodic. Thus etching takes place on the workpiece surface. Very thin planar deposits can be obtained by first depositing a planar layer using an ECMD technique and then using an ECME technique on the planar film in the same electrolyte by reversing the applied voltage. Alternately, the ECME step can be carried out in a separate machine and a different etching electrolyte. The thickness of the deposit may be reduced in a planar manner.

Descriptions of various planar deposition and planar etching methods i.e. ECMPR approaches and apparatus can be found in the following patents and pending applications, all commonly owned by the assignee of the present invention. U.S. Pat. No. 6,126,992 entitled "Method and Apparatus for Electrochemical Mechanical Deposition." U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2001, and application Ser. No. 09/169,913 filed on Sep. 20, 2001, entitled "Plating Method and Apparatus for Controlling Deposition on Predetermined Portions of a Workpiece". These methods can deposit metals in and over cavity sections on a workpiece in a planar manner. They also have the capability of yielding novel structures with excess amount of metals selectively over the features irrespective of their size, if desired.

The surface of the WSID preferably contains hard-abrasive material for efficient sweeping. U.S. application Ser. No. 09/960,236 filed on Sep. 20, 2001, entitled "Mask Plate Design,",U.S. Provisional Application Ser. No. 60/326,087 filed on Sep. 28, 2001, entitled "Low Force Electrochemical Mechanical Processing Method and Apparatus," and U.S. application Ser. No. 10/155,828 filed May 23, 2002, all of which are assigned to the same assignee as the present invention, disclose various workpiece-surface-influencing device embodiments.

Fixed abrasive sheets or pads, which are supplied by companies such as 3M and which are commonly used in CMP applications, work efficiently on WSID surfaces. Such abrasive sheets are generally comprised of abrasive composites that have a discernible precise shape such as pyramidal or cylindrical. The abrasive composite shapes include a plurality of abrasive grains dispersed in a binder that also bonds abrasive composite shapes to a backing. During a CMP process, as the abrasive sheet is being used to abrade a surface, the abrasive composite shapes break down and expose unused abrasive grains embedded in the binder. As the sheet is used for an extended time period, the composite shapes further break down and expose more abrasive grains. For an ECMPR process, due to the constant breaking down of the abrasive layer, such abrasive sheets have relatively short life time and need to be replaced often. This in turn lowers throughput and also adversely affect product consistency.

Therefore, it will be desirable to provide a longer life abrasive and hard surface for the WSID used in an ECMPR technique.

SUMMARY OF THE INVENTION

The present invention is directed to a top surface of a workpiece surface influencing device and a method of using the same. The top surface of the workpiece surface influencing device is adapted for use in an electrochemical mechanical processing apparatus in which a solution becomes disposed onto a conductive surface of a workpiece and electrochemical mechanical processing of the conductive surface is performed while relative movement and physical contact exists between the top surface and the conductive surface. The top surface comprises a ceramic material that presents a substantially planar contact area to the conductive surface, the ceramic material having a hardness greater than that of the conductive surface. A plurality of channels are formed through the top surface.

In one aspect, the substantially planar contact area includes a plurality of contact regions, each of the contact regions including a region top surface that is substantially planar with other region top surfaces. These plurality of contact regions may each be raised above a layer disposed below, which layer may be another ceramic material, or a metal that can be used as an anode or a cathode. Each of the plurality of contact regions will have an associated region top surface, which may be flat, rounded, triangular or some other shape, such that the top portion of each of the region top surfaces together form a substantially planar contact area.

In another embodiment each of a plurality of contact regions is formed as a separable sweep element, thereby resulting in a plurality of separable sweep elements. The separable sweep elements can have a region top surface that is flat, rounded, triangular, or some other shape. Further, the sweep elements may include drain channels, particularly on the leading edge of the sweep element.

The method according to the present invention provides for electrochemical mechanical processing of a conductive surface of a workpiece using a workpiece surface influencing device as described above and hereinafter.

BRIEF DESCRIPTION OF THE DRAWINGS

FIGS. 5B-5H schematically shows cross-sectional views of various embodiments of the sweep elements and drain channels according to the present invention;

DETAILED DESCRIPTION OF THE PREFERRED EMBODIMENT

In one embodiment, a workpiece surface influencing device (WSID) of the present invention includes a pattern of raised regions that provides a longer life cycle when compared to a conventional WSID. As used herein, the terms "workpiece surface," "wafer surface" and the like include, but are not limited to, the surface of the work piece or wafer prior to processing and the surface of any layer formed thereon, including oxidized metals, oxides, spun-on glass, ceramics, etc.

Figure 2:
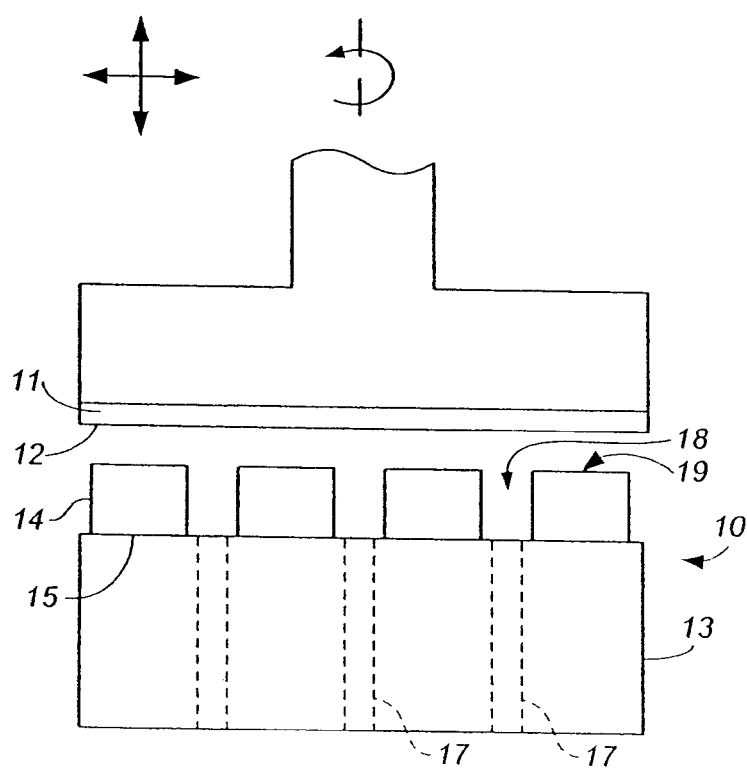
FIG. 2 schematically depicts a portion of an ECMPR system using an embodiment of a WSID of the present invention.

Reference will now be made to the drawings wherein like numerals refer to like parts throughout. FIG. 2 schematically depicts one embodiment of a WSID of the present invention, which WSID is placed in close proximity of a workpiece 11, such as a wafer, having a surface 12 to be plated.

Figure 1:
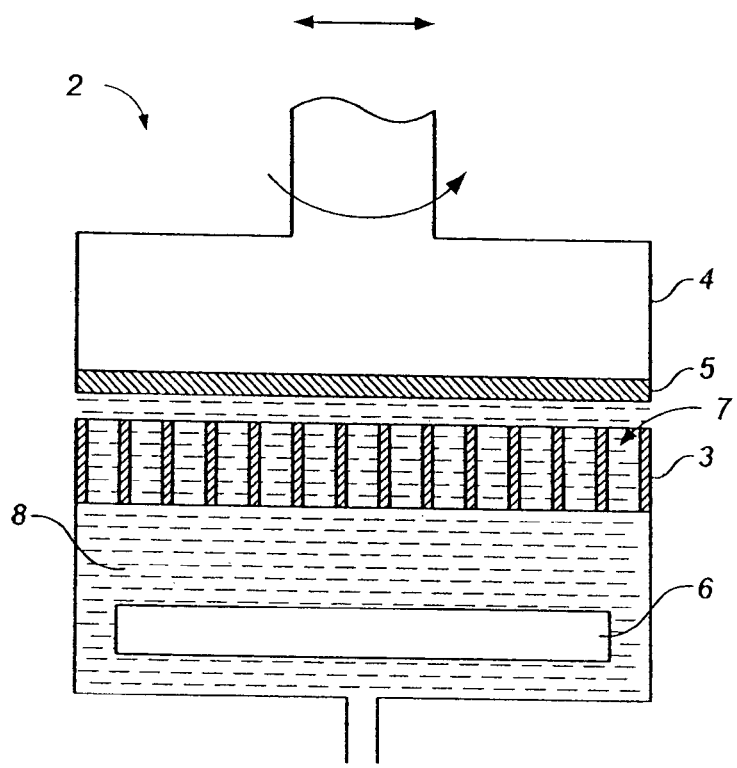
FIG. 1 schematically depicts an ECMPR system.

The WSID may include a body 13 having a plurality of raised regions 14 and recessed regions 18 distributed on an upper surface of the WSID body 13. Recessed regions 18 are surface channels extending along the surface 15 of the WSID body 13. A top surface 19 of the raised regions 14 sweeps the wafer surface 12 during the process. The WSID body 13 may be constructed of more than one layer. Preferably, the body 13 is comprised of materials that are non-reactive with the deposited or etched metal layer and the process solution that is used. Thus, the body 13 may be one of a reinforced or pure polymeric material, a metallic material, a ceramic material, a glass material, and mixtures thereof. Useful polymeric materials include polypropylene and polyvinyl chloride (PVC). Metallic materials can include titanium, tantalum, or their platinum coated versions. The WSID body 13 can also be an electrode for example an anode for the above described ECMD processes and a cathode for the above described ECME processes. In such case, parts of the WSID body that may contact the workpiece can be coated with an insulator layer, or the raised regions can be made of insulating materials. Irrespective of whether the body 13 is an electrode or just a support element for the raised regions, the WSID body 13 preferably includes a plurality of openings or channels 17. Channels 17 communicate electrolyte between an electrode (not shown) and the wafer surface 12 on which a metal layer, preferably copper layer, may be deposited (See also FIG. 1). Channels 17 are connected to the recessed regions 18 and may have the same width and length as the recessed regions 18. The plurality of raised regions 14 may be an integral part of or non-separable from the body 13. Thus, the raised regions 14 may comprise the same material as the body 13. Additionally, the plurality of raised regions 14 is preferably disposed in a pattern, and the recessed regions 18 continue among them. While each of the raised regions 14 is illustrated as being of the same size and configuration, the present invention contemplates that the raised regions 14 may be constructed with differing sizes and configurations. In general, the raised regions 14 and in particular the top surface 19 of the raised regions, may serve to sweep the electrolyte across the wafer surface 12 as well as polish the wafer surface 12. As with the raised regions 14, the recessed regions 18 among the raised regions may be constructed with the same or differing sizes and configurations.

Figure 3:
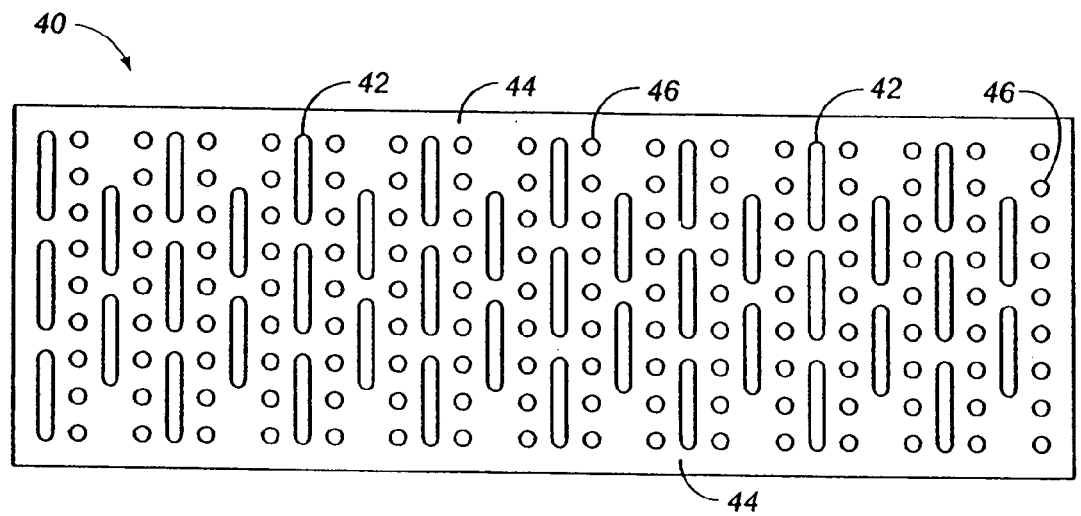
FIG. 3 schematically depicts a planar view of an embodiment of a WSID of the present invention.

FIG. 3 schematically shows a top view of an exemplary embodiment of a WSID 40 with a pattern of raised regions 42 together with recessed regions 44 and channels 46 or holes. While FIG. 3 shows the patterns of raised regions 42 and recessed regions 44 in a regular sequence, the scope of the present invention also includes a pattern of an irregular sequence. In FIG. 3, the raised regions 42 may be in the shape of ribs or blades. The raised regions 42 may also have a triangular cross section (not shown). Between the raised regions 42 may be a plurality of recessed regions 44 connected to the channels 46.

Figure 4:
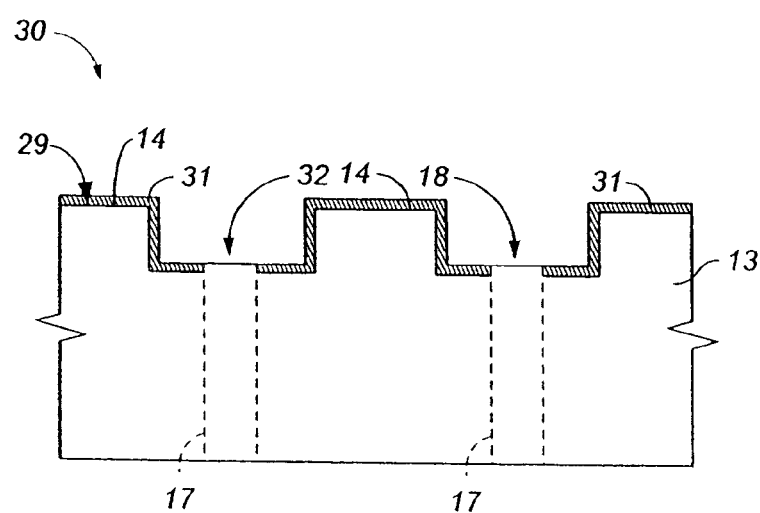
FIG. 4 schematically depicts a side cross section of an embodiment of a WSID of the present invention.

As shown in FIG. 4, in another embodiment, which schematically depicts a side cross sectional view of a portion of a WSID 30. The WSID 30 may include a top surface 29. In this embodiment, an outer layer 31 is formed on and conformally coats and the top surface 29 and hence the raised and recessed regions 14, 18. As will be described below, the outer layer may 31 be made of an insulating material. As seen in FIG. 4, the outer layer 31 may have openings 32 to enable the electrolyte to flow between the channels 17 and the recessed regions 18.

Figure 5A:
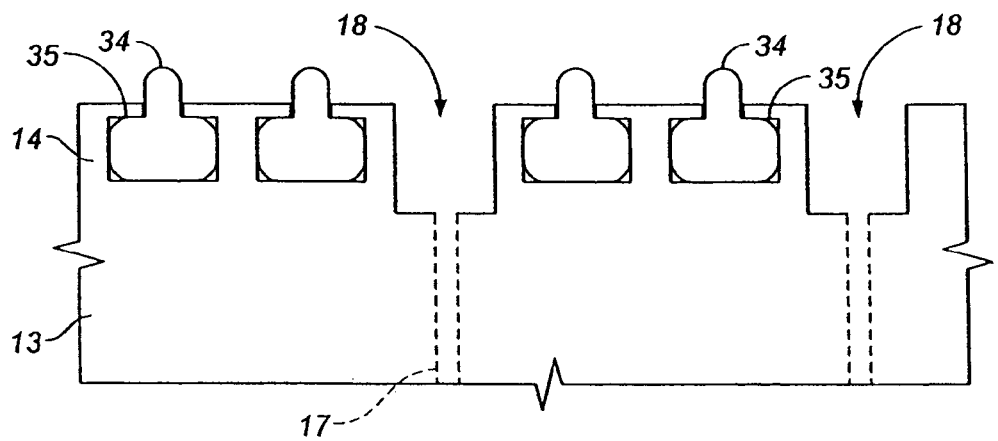
FIG. 5A schematically shows sweep elements in conjunction with the WSID according to the present invention.
Figure 5I:
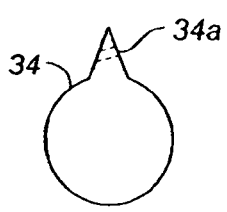
FIG. 5I schematically shows a perspective view of a sweep element and drain channel according to the present invention.
Figure 5I:
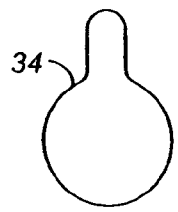
Figure 5I:
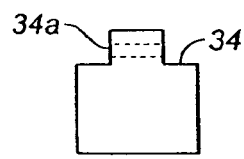
Figure 5I:
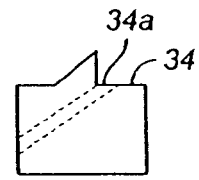
Figure 5I:
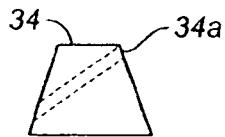
Figure 5I:
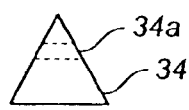
Figure 5I:
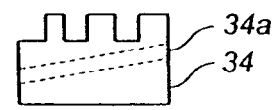
Figure 5I:
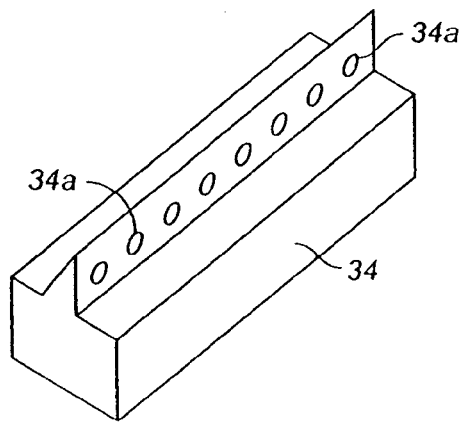

Optionally, and as shown in FIG. 5A, top of the WSID 30 may further include a plurality of surface features 34 or sweep elements integrated and/or separable from the WSID 30. The sweep elements 34 can help sweep the electrolyte from the work piece surface 12 (see FIG. 2). The sweep elements 34 may also be integrated into and/or separable from the raised regions 14. In other words, the plurality of sweep elements 34 may be removable, replaceable, and/or re-buildable as needed. For example, the sweep elements 34 may be placed into or held in place by grooves 35 formed in the WSID body 13 or in the raised regions 14. When the sweep elements 34 are worn, they can be replaced by a new set of sweep elements 34 (such as with a cartridge of sweep elements). Replacement of them can be performed by sliding the sweep elements 34 into the grooves 35. Accordingly, the sweep elements 34 may be made of titanium, titanium oxide, aluminum oxide, polyamides, epoxies, reinforced structural polymers or ceramics or various combinations. The sweep elements may be of various configurations, such as that shown in FIG. 5B, to cooperate with the raised regions 14 in sweeping process solution across and from the wafer surface 12. A useful dimension for the sweep element 34 is between about 0.1 micron to 20 mm.

The sweep elements 34 may also contain channels 34a for draining electrolyte off the surface 12 of the work piece 11 (FIG. 2). Also, the channels 34a can enhance fluid mixing or transfer within the fluid boundary layer regions between the sweep elements 34 and work piece 11 (FIG. 2). Concurrently, the affected electrolyte is prevented from accumulating in front of the sweep elements 34 by draining through the channels 34a. Thus, the channels 34a enhances mass transfer at the work piece interface and help reduce the accumulation of electrolyte in the work piece interface during the sweeping action. The channels 34a in the sweep elements may be of various configurations, such as circular, rectangular, and triangular. Regardless of the shape of the channels 34a, the channels may be spread from one another by around 2 to 5 mm. The drain channels 34a of the sweep elements 34 may be parallel or inclined to the leading edge of the sweep elements 34. The relative position of the channels 34a and their orientation is such that they can maximize the preferential deposition of high quality metal in the various features or cavities (see FIG. 7) in the work piece 11.

Figure 6A:
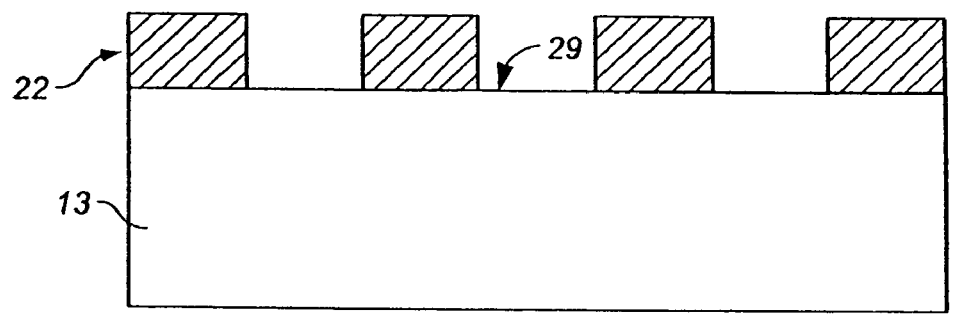
FIGS. 6A to 6D schematically show a method of making an embodiment of a WSID of the present invention.

In making the WSID 30, FIGS. 6A to 6D schematically depict one preferred method. In FIG. 6A, the WSID body 13 may initially be patterned by one of a photolithographic method and/or a masking method. While the foregoing methods are preferred due to manufacturing ease, conventional machining, laser ablation, or water jet material fabrication methods may also be used. Either of the foregoing preferred methods can employ conventional techniques to produce a patterned mask 22 on the top surface 29 of the WSID body 13. The patterned mask 22 preferably provides a pattern that matches the pattern of raised regions 14 that will eventually be produced on the top surface 29.

Figure 6B:
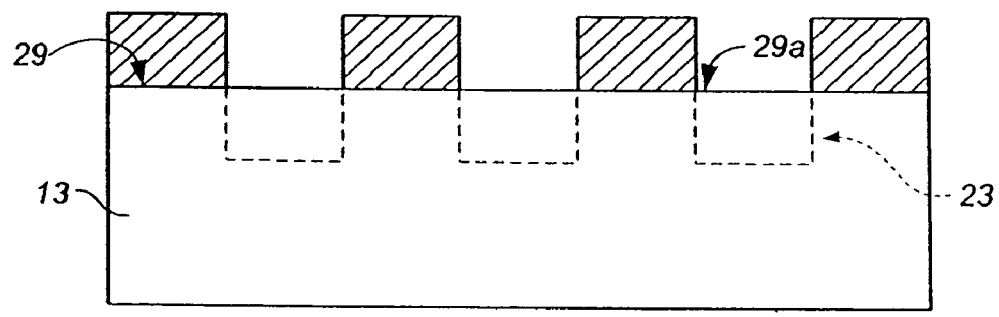
Figure 6C:
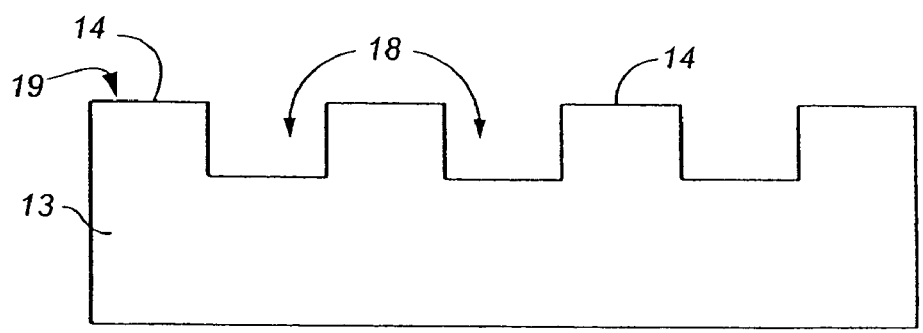

Next, as shown in FIG. 6B, exposed portions 29a of the top surface 29 can be etched so as to produce relief structures 23 that may become the eventual recessed regions 18. Thereafter, the patterned mask 22 may be removed by conventional methods; thereby leaving the raised regions 14 and the recessed regions 18 integrated onto the top surface 29, as shown in FIG. 6C.

Figure 6D:
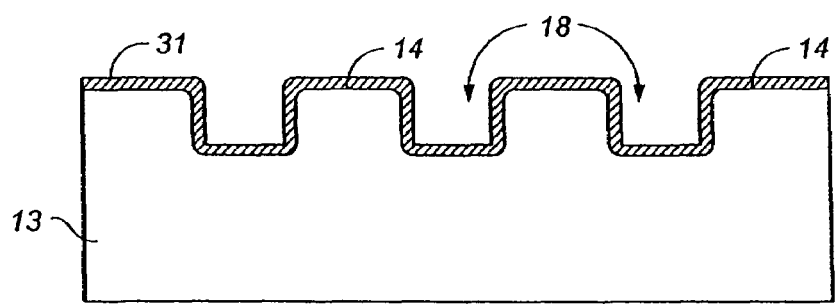

In FIG. 6D, the outer layer 31 or an insulating layer, which is also shown in FIG. 4, may be formed on the exposed surfaces of the raised and recessed regions using methods such as anodization, sputtering, spin coating, and baking. The insulating layer 31 is a hard material and serves to polish the workpiece surface 12 (see FIG. 2) as it is plated. The layer 31 protects the WSID 30 and provides electrical insulation for it when contact is made with the workpiece surface 12. Accordingly, the insulating layer 31 may be made of $Al_2O_3$, SiN, $TiO_2$, or other ceramics, and particulate reinforced chemical resistant polymers and mixtures thereof, and produced by well-known methods such as dipping, spin coating, spraying and sputtering. In a specific example, the insulating layer 31 may be fabricated by anodizing the exposed surfaces of raised and recessed regions 14, 18. For example the WSID maybe made of Ti or Ta and the surface may be anodized to obtain a protective hard layer of Ti-oxide or Ta-oxide. Referring to FIG. 6D, in another specific example, if the WSID body 13 is made of a hard polymeric material such as a polycarbonate or high density polyethylene, the layer 31 can be formed as a hard coating or an abrasive surface. In this case abrasiveness of the layer 31 can be controlled by selecting materials from different friction coefficients. For example, if the coating include alumina it will be hard and abrasive. If it includes diamond like carbon coating, it will be hard but less abrasive because such coatings are more slippery. Best abrasive coating can be selected by selecting the coating without changing the shape of the surface of the WSID.

Following the formation of the insulating layer 31, the channels 17 may be formed by machining the channels through the WSID 30. The channels may be formed by various methods such as drilling, electro etching, wet etching, laser ablation, water jet cutting, etc.

Figure 6E:
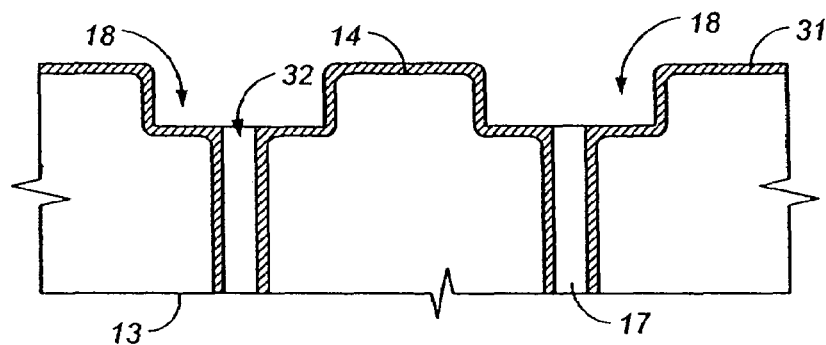
FIG. 6E schematically shows an alternative step in method of making a WSID of the present invention.

Alternatively, the insulating layer 31 may be formed after the openings 32 are formed, thereby producing an insulating layer 31 not only over the raised and recessed regions 14, 18 but also over the walls of the channels 17, as shown in FIG. 6E. In another embodiment, the initial topography of the WSID structure, including the raised regions 14, the channels 17 and recessed regions 18, may be fabricated by mechanically machining the WSID. Thereafter, the structure's surface can be selectively anodized or spin coated with a suitable insulating, abrasive or electrolyte sweeping elements or devices.

In view of the above, it can be seen that the present invention can provide a way of rebuilding of a plurality of newer raised regions and recessed regions after the raised regions in use are worn. In other words, a second plurality of raised regions and recessed regions are produced by reprocessing the used WSID. Such rebuilding can be accomplished by removing the worn raised regions or surface, such as by wet etch methods, oxygen plasma, or machine resurfacing. Thereafter, new or second raised regions are reformed, such as by anodizing the prepared surface or spin coating on the prepared surface. Although not necessary, a reformed or second mask may correlate to the prior pattern of raised regions and recessed regions. The exposed areas of the second mask may then be insulated or anodized with another insulating or anodized layer. The entire WSID may be then annealed to toughen the WSID 30, and improve its chemical resistance to various electrolytes.

Figure 7:
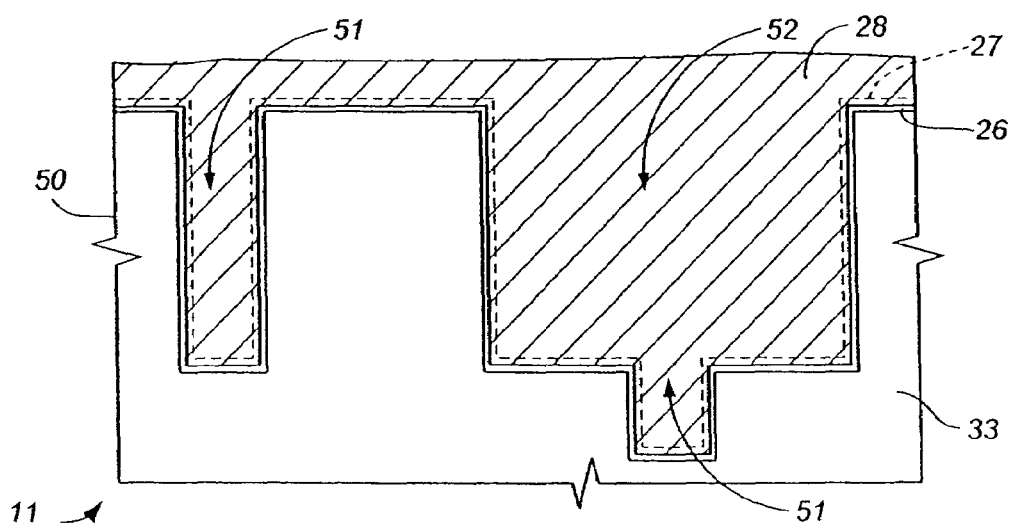
FIG. 7 schematically depicts a planar copper layer formed on a surface of a workpiece using the WSID of the present invention.

Whichever particular embodiment of the WSID 10, WSID 30 or method of the present invention is employed, FIG. 7 schematically depicts a portion 50 of the workpiece 11, shown in FIG. 2, on which a planar metal layer 28, a copper layer, produced using the ECMPR. The planar metal layer 28 is formed on the workpiece by filling features or cavities such as vias 51 and trenches 52 formed through an insulating layer 33. Conventionally, a barrier layer 26, preferably a Ta or TaN layer and a seed layer 27, preferably a thin copper layer are coated over the insulating layer 33 having the features 51, 52 before the copper plating of the workpiece. The WSID of the present invention may be used to remove, i.e., etch or electro-etch or electro-polish as in the CMP of copper on a wafer or a substrate.

It should be understood, of course, that the foregoing relates to preferred embodiments of the invention and that modifications may be made without departing from the spirit and scope of the invention.

What is claimed is:

1. A method of electrochemical mechanical processing a conductive surface of a workpiece using a solution, comprising:
   disposing the solution onto the conductive surface of the workpiece;
   electrochemically mechanically processing the conductive surface in the presence of the solution while relative movement and physical contact exists between a top surface of a workpiece surface influencing device and the conductive surface, wherein the top surface of the workpiece surface influencing device is a ceramic material that presents a substantially planar contact area to the conductive surface, the contact area including a plurality of contact regions formed over a conducting material having recessed and raised regions, and wherein a plurality of channels are formed through the top surface through which the solution passes, wherein each of the plurality of contact regions is formed over the conducting material as a separable sweeper; and
   inserting each separable sweeper into the workpiece surface influencing device prior to disposing the solution.

2. The method according to claim 1, further comprising draining the solution off the conductive surface of the workpiece by allowing the solution to flow through drain channels in at least some of the separable sweepers.

3. The method according to claim 1, wherein electrochemically mechanically processing is electrochemically mechanically depositing a conductor onto the conductive surface.

4. The method according to claim 1, wherein electrochemically mechanically processing is electrochemically mechanically polishing conductive material from the conductive surface.

5. The method according to claim 1, wherein each of the plurality of contact regions has a top surface that is rounded, such that a top rounded portion of each of the rounded contact regions together form the substantially planar contact area.

6. The method according to claim 1, wherein each of the plurality of contact regions has a top surface that is triangular, such that a top edge portion of each of the triangular contact regions together form the substantially planar contact area.

7. The method of according to claim 1, further comprising contacting an electrode with the solution while relative movement and physical contact exist between the top surface of the workpiece surface influencing device and the conductive surface of the workpiece.

8. The method of according to claim 1, further comprising providing an electrical connection to the conducting material through an exposed area of the conducting material to enable the conducting material to operate as a cathode or an anode.

9. A method of electrochemical mechanical processing a conductive surface of a workpiece using an electrolyte, comprising:
   flowing the electrolyte through channels in a workpiece surface influencing device onto the conductive surface of the workpiece;
   electrochemically mechanically processing the conductive surface in the presence of the electrolyte while sweeping the conductive surface with the top surface of a workpiece surface influencing device, wherein the top surface of the workpiece surface influencing device is an insulating material that coats another material having raised regions and recessed regions.

10. The method of claim 9, wherein the raised regions comprise separable sweep elements.

11. The method of claim 10, further comprising sliding at least one separable sweep element into a groove on the top surface of the workpiece surface influencing device.

12. The method of claim 10, further comprising draining electrolyte off the conductive surface of the workpiece through a drain channel in at least one separable sweep element.

13. The method of claim 9, wherein the insulating material is a ceramic.

14. The method of claim 9, further comprising contacting an electrode with the electrolyte while sweeping the conductive surface of the workpiece.

15. The method of claim 9, wherein electrochemically mechanically processing comprises electrochemically mechanically depositing conductive material onto the conductive surface.

16. The method of claim 9, wherein electrochemically mechanically processing comprises electrochemically mechanically removing conductive material from the conductive surface.

17. The method of claim 9, wherein the another material is a ceramic material.

18. The method of claim 9, wherein the another material is a conducting material.

* * * * *

UNITED STATES PATENT AND TRADEMARK OFFICE
CERTIFICATE OF CORRECTION

PATENT NO. : 7,670,473 B1  Page 1 of 1
APPLICATION NO. : 11/786948
DATED : March 2, 2010
INVENTOR(S) : Cyprian E. Uzoh et al.

It is certified that error appears in the above-identified patent and that said Letters Patent is hereby corrected as shown below:

At Column 8, Line 16, in Claim 7, after "method" delete "of".

At Column 8, Line 21, in Claim 8, after "method" delete "of".

Signed and Sealed this

Sixteenth Day of November, 2010

David J. Kappos
*Director of the United States Patent and Trademark Office*